United States Patent
Walker

(10) Patent No.: US 7,271,664 B2
(45) Date of Patent: Sep. 18, 2007

(54) PHASE LOCKED LOOP CIRCUIT

(75) Inventor: Samuel J. Walker, Tigard, OR (US)

(73) Assignee: Credence Systems Corporation, Milpitas, CA (US)

( * ) Notice: Subject to any disclaimer, the term of this patent is extended or adjusted under 35 U.S.C. 154(b) by 60 days.

(21) Appl. No.: 11/253,891

(22) Filed: Oct. 18, 2005

(65) Prior Publication Data

US 2007/0085610 A1    Apr. 19, 2007

(51) Int. Cl.
*H03L 7/00* (2006.01)

(52) U.S. Cl. ............... 331/1 A; 331/78; 327/156; 327/159; 327/160

(58) Field of Classification Search ............... 327/156, 327/147; 331/78, 1 A, 159, 160; 375/376
See application file for complete search history.

(56) References Cited

U.S. PATENT DOCUMENTS 6,294,936 B1 * 9/2001 Clementi ............ 327/156

* cited by examiner

*Primary Examiner*—Arnold Kinkead
(74) *Attorney, Agent, or Firm*—John Smith-Hill; Smith-Hill and Bedell

(57) ABSTRACT

A phase locked loop circuit (PLL) has a reference terminal for receiving a reference signal and an output terminal for providing an output signal. The PLL comprises a phase comparator having first and second inputs and having an output at which it provides a signal that depends on phase difference between signals received at the first and second inputs respectively, a voltage controlled oscillator (VCO) having a control input coupled to the output of the phase comparator and having an output coupled to the output terminal of the PLL, the VCO generating an output signal having a frequency that depends on the voltage of a signal received at the control input of the VCO, a feedback path coupled to the output of the VCO for providing a feedback signal, and a bitstream generator for generating first and second pseudo random bitstreams (PRBSs) in response to the reference signal and the feedback signal respectively and applying the first and second PRBSs to the first and second inputs respectively of the phase comparator.

8 Claims, 1 Drawing Sheet

PHASE LOCKED LOOP CIRCUIT

BACKGROUND OF THE INVENTION

This invention relates to a phase locked loop circuit.

Referring to FIG. 1 of the drawings, a conventional phase locked loop circuit (PLL) comprises a phase comparator 10, a low pass filter 14, a voltage controlled oscillator (VCO) 18 and a divider 22. A reference signal source, such as a crystal oscillator 26, provides a reference signal at a frequency FR to one input of the phase comparator and the output of the divider is connected to the other input of the phase comparator. The phase comparator generates as its output signal a pulse train in which the pulses have a duration that depends on the phase difference between the output signal of the divider and the reference signal. The low pass filter 14 integrates the pulse signal of the phase comparator over a period substantially greater than the interval between pulses and provides a DC output signal at a voltage that depends on the duration of the pulses provided by the phase comparator. The VCO generates an output signal at a frequency that is a function of the voltage of the DC signal provided by the low pass filter. The divider divides the frequency of the VCO output signal by a selected factor D. The output signal of the divider is fed back to the second input of the phase comparator. The PLL forces the feedback signal into phase with the reference signal by causing the VCO to oscillate at a frequency $F_R*D$. For example, in the event that the reference signal is a 10 MHz signal and the divider divides by 10, the VCO output signal is at a frequency of 100 MHz.

In the case of the conventional PLL, as shown in FIG. 1, the pulses produced by the phase comparator occur at the reference frequency $F_R$ and the low pass filter 14 passes signal energy at the reference frequency to the VCO. Accordingly the energy spectrum of the output signal of the VCO has a primary lobe at the frequency $F_R*D$ and also includes secondary lobes at the frequencies $F_R*D+/-F_R$. It is desirable to minimize energy at frequencies other than $F_R*D$.

One technique for reducing the height of the secondary lobes would be to employ a fractional N PLL. For example, one could control the divider to divide part of the time by the factor 9.9, part of the time by the factor 10 and part of the time by the factor 10.1, so that the average factor is 10, and in this case the energy of the secondary lobes would be distributed over multiple lobes, each of which would contain less energy than the secondary lobes in the case that the factor were 10 at all times. However, this solution is subject to the disadvantage that the primary lobe is wider and lower than if the factor were 10 at all times.

SUMMARY OF THE INVENTION

In accordance with the invention there is provided a phase locked loop circuit (PLL) having a reference terminal for receiving a reference signal and an output terminal for providing an output signal, the PLL comprising a phase comparator having first and second inputs and having an output at which it provides a signal that depends on phase difference between signals received at the first and second inputs respectively, a voltage controlled oscillator (VCO) having a control input coupled to the output of the phase comparator and having an output coupled to the output terminal of the PLL, the VCO generating an output signal having a frequency that depends on the voltage of a signal received at the control input of the VCO, a feedback path coupled to the output of the VCO for providing a feedback signal, and a bitstream generator for generating first and second pseudo random bitstreams (PRBSs) in response to the reference signal and the feedback signal respectively and applying the first and second PRBSs to the first and second inputs respectively of the phase comparator.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
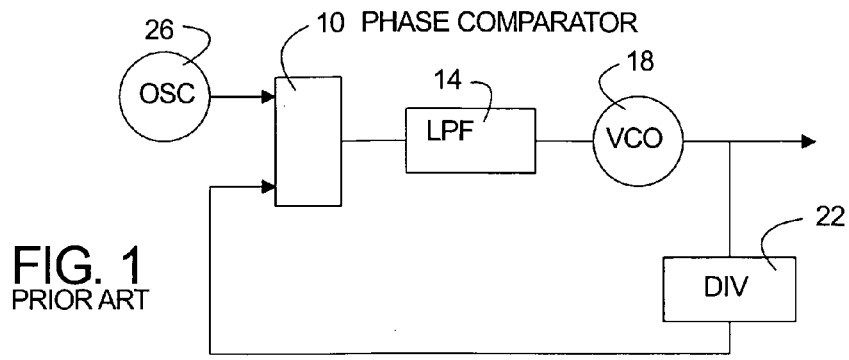
FIG. 1 is a block schematic diagram of a conventional phase locked loop circuit.
Figure 2:
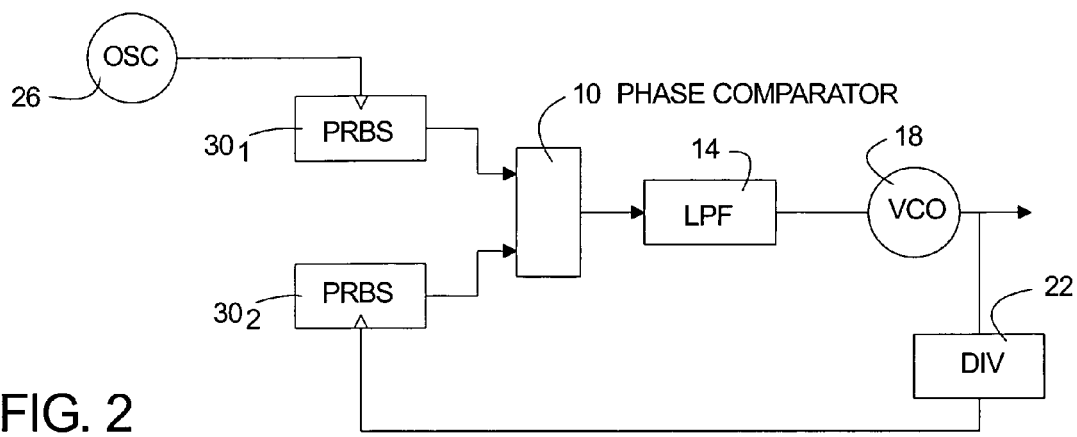
FIG. 2 is a block schematic diagram of a first PLL embodying the present invention.

The PLL shown in FIG. 2 differs from the conventional PLL shown in FIG. 1 by including first and second pseudo random bit stream (PRBS) generators $30_1$ and $30_2$. The generator $30_1$ is clocked by the reference signal and the generator $30_2$ is clocked by the feedback signal. The PRBS generators 30 are able to operate in a start-up mode and a normal mode. In the start-up mode, each generator generates an alternating sequence of 1s and 0s in response to successive rising (or falling) edges of its respective clock signal whereas in the normal mode the two generators generate identical respective pseudo random bit streams in response to clock edges of the respective clock signals.

The length of the pseudo random bit streams depends on the reference signal frequency, the desired output frequency, and on the extent to which it is desired to reduce the height of the secondary lobes in the energy spectrum.

In order to acquire lock, the PRBS generators 30 are operated in the start-up mode and supply sequences of 1s and 0s to the inputs of the phase comparator. These regular alternating sequences allow the PLL to acquire lock and the VCO then oscillates at the frequency $F_R*D$. Once lock has been acquired, which may be verified by measuring the frequency of the feedback signal, the PRBS generators are switched to the normal mode and each then provides a pseudo random bit stream to the phase detector.

Referring to FIG. 2, if the PLL has acquired lock and the feedback signal is accordingly in phase with the reference signal (within lock range), the bit sequence provided by the generator $30_2$ is identical to that provided by the generator $30_1$ and the two sequences are in phase. Accordingly, the sequences provided to the inputs of the phase comparator are identical and are in phase, and the pulses generated by the phase comparator are of a duration that maintains the output voltage of the low pass filter at a constant value. However, because the input signals to the phase comparator are pseudo random bit streams, the energy content at the reference frequency in the output signal of the phase comparator is much less than in the case of the PLL shown in FIG. 1 and accordingly the secondary lobes in the energy spectrum of the output of the VCO are substantially lower than in the case of the PLL shown in FIG. 1.

The PRBS generators $30_1$ and $30_2$ may be implemented by a field programmable gate array (FPGA). An FPGA having two time domains that can be controlled by the reference signal and the feedback signal respectively is commercially available. The FPGA may generate the two PRBSs by using identical combinational and/or sequential logic for the two generators respectively, or it may contain two identical stored sequences of bits that are clocked out in sequence in response to the reference signal and the feedback signal respectively. The FPGA may also be programmed to implement a frequency counter for the feedback signal, so that it is not necessary to provide any additional circuitry for testing whether lock has been acquired and the PRBS generators should be switched to the normal mode.

Figure 3:
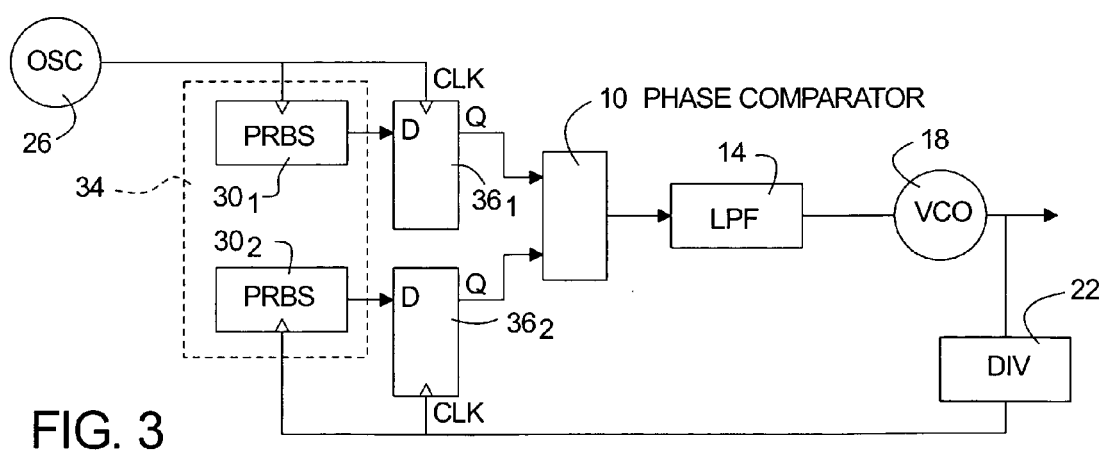
FIG. 3 is a block schematic diagram of a second PLL embodying the present invention.

It is important to proper operation of the PLL shown in FIG. 2 that the jitter performance of the PRBS generators be good, i.e. that there be a consistent relationship between the time at which the PRBS is clocked and the time at which the output of the PRBS generator changes in response to the clock. However, the jitter performance of a conventional FPGA that is programmed to function as a PRBS generator is rather poor. Referring to FIG. 3, the PLL shown in FIG. 2 can be immunized from poor jitter performance of the PRBS generators 30 implemented by the FPGA 34 by coupling the outputs of the PRBS generators to the inputs of the phase comparator using high performance discrete D-type flip-flops that are clocked by the reference signal and the feedback signal respectively. Thus, the outputs of the PRBS generators $30_1$ and $30_2$ are coupled to the D inputs of respective D-type flip flops $36_1$ and $36_2$, which are clocked by the reference signal and the feedback signal respectively and whose Q outputs are connected to the inputs of the phase comparator 10. The timing of the change in state of the Q outputs of the flip flops depends closely on the respective clock signals, and is not affected by jitter in the outputs of the generators, provided that the jitter is less than the clock period.

Figure 4:
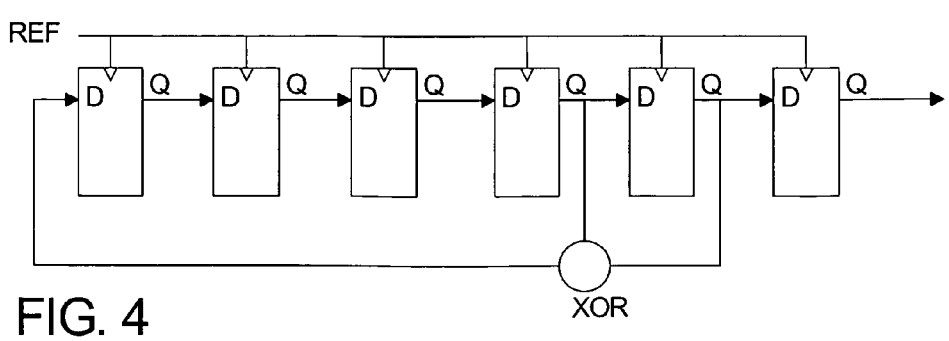
FIG. 4 is a block schematic diagram of a linear feedback shift register, which may be employed as the PRBS generator in a PLL embodying the present invention.

Referring to FIG. 4, the pseudo random bit stream may be generated using a linear feed back shift register composed of D-type flip flops and one or more exclusive OR gates. In this case, it is not necessary to provide a separate D-type flip flop for coupling the PRBS generator to the phase comparator because the final stage of the shift register is a flip flop.

In the event that the pseudo random bit stream generators are linear feedback shift registers, it may be necessary to permit two different feedback patterns, for start up and normal operation respectively, such that in the start up mode, the shift register provides the alternating sequence of 1s and 0s and in the normal operation mode, the shift register provides a pseudo random bit stream of the desired length.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

The invention claimed is:

1. A phase locked loop circuit (PLL) having a reference terminal for receiving a reference signal and an output terminal for providing an output signal, the PLL comprising:
   a phase comparator having first and second inputs and having an output at which it provides a signal that depends on phase difference between signals received at the first and second inputs respectively,
   a voltage controlled oscillator (VCO) having a control input coupled to the output of the phase comparator and having an output coupled to the output terminal of the PLL, the VCO generating an output signal having a frequency that depends on the voltage of a signal received at the control input of the VCO,
   a feedback path coupled to the output of the VCO for providing a feedback signal, and
   a bitstream generator for generating first and second pseudo random bitstreams (PRBSs) in response to the reference signal and the feedback signal respectively and applying the first and second PRBSs to the first and second inputs respectively of the phase comparator.

2. A PLL according to claim 1, comprising a first flip flop having a data input, a clock input coupled to the reference terminal, and a data output, and a second flip flop having a clock input coupled to the output terminal, a data input and a data output, wherein the data inputs of the first and second flip flops are connected to receive the first and second PRBSs respectively and the data outputs of the first and second flip flops are coupled to the first and second inputs respectively of the phase comparator.

3. A PLL according to claim 2, wherein the bitstream generator comprises a field programmable gate array.

4. A PLL according to claim 1, wherein the bitstream generator comprises first and second linear feedback shift registers.

5. A PLL according to claim 1, wherein the bitstream generator has a first mode of operation in which it generates first and second alternating sequences of logic 1s and 0s, and a second mode of operation in which it generates said first and second PRBSs.

6. A PLL according to claim 1, wherein the bitstream generator has a first clock input connected to the reference terminal and a second clock input connected to the feedback path.

7. A PLL according to claim 1, wherein the feeback path comprises a divider having an input connected to the output of the VCO and an output connected to the second clock input of the bitstream generator.

8. A PLL according to claim 1, comprising a field programmable gate array that is programmed to implement the bitstream generator and a frequency counter for measuring the frequency of the feedback signal.

* * * * *